United States Patent
Kukal et al.

(10) Patent No.: US 9,928,318 B1
(45) Date of Patent: Mar. 27, 2018

(54) SYSTEM AND METHOD FOR SIMULATING CHANNELS

(71) Applicant: Cadence Design Systems, Inc., San Jose, CA (US)

(72) Inventors: Taranjit Singh Kukal, Delhi (IN); Kumar Chidhambara Keshavan, Medford, MA (US); Bradford Chastain Griffin, Londonderry, NH (US); Kenneth R. Willis, Matthews, NC (US); Shivani Sharma, Faridabad (IN); Ambrish Kant Varma, Chelmsford, MA (US); Xuegang Zeng, Westborough, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/142,694

(22) Filed: Apr. 29, 2016

(51) Int. Cl.
  *G06F 17/00* (2006.01)
  *G06F 17/50* (2006.01)
(52) U.S. Cl.
  CPC ................ *G06F 17/5009* (2013.01)
(58) Field of Classification Search
  USPC ........................................... 716/106
  See application file for complete search history.

(56) References Cited

U.S. PATENT DOCUMENTS

| | | | |
|---|---|---|---|
| 7,627,463 B2 | 12/2009 | Chidhambarakrishnan | |
| 2008/0155483 A1* | 6/2008 | Chen | G06F 17/5009 716/102 |
| 2013/0332101 A1* | 12/2013 | Pickerd | G06F 11/30 702/119 |
| 2016/0253446 A1* | 9/2016 | Chong | G06F 17/5036 |

* cited by examiner

*Primary Examiner* — Mohammed Alam
(74) *Attorney, Agent, or Firm* — Mark H. Whittenberger, Esq.; Holland & Knight LLP

(57) ABSTRACT

The present disclosure relates to a system and method for simulating channels in an electronic circuit design. Embodiments may include receiving, at one or more computing devices, an electronic circuit design including at least one channel. Embodiments may further include transmitting two or more inputs from two or more transmitter drivers on two or more wires to the at least one channel. In some embodiments, the inputs may be distributed across the wires based upon a chordal code. Embodiments may also include generating simulated waveforms based upon the inputs. Embodiments may further include transmitting the simulated waveforms from the channel on the wires to a comparator block. Embodiments may also include comparing the simulated waveforms on the wires at the comparator block to produce two or more simulated outputs. Embodiments may include transmitting the simulated outputs from the comparator block on the wires to two or more post-comparator receivers.

20 Claims, 12 Drawing Sheets

$$\begin{bmatrix} h_{11}(t) & h_{12}(t) & h_{13}(t) & h_{14}(t) \\ h_{21}(t) & h_{22}(t) & h_{23}(t) & h_{24}(t) \\ h_{31}(t) & h_{32}(t) & h_{33}(t) & h_{34}(t) \\ h_{41}(t) & h_{42}(t) & h_{43}(t) & h_{44}(t) \end{bmatrix}$$

SYSTEM AND METHOD FOR SIMULATING CHANNELS

FIELD OF THE INVENTION

The present disclosure relates to electronic design automation (EDA), and more specifically, to a system and method for simulating channels in an electronic circuit design.

DISCUSSION OF THE RELATED ART

EDA utilizes software tools that may be used in the design and analysis of numerous electronic systems such as printed circuit boards (PCBs) and integrated circuits (ICs). In particular, PCB channels and channel package interconnects may be simulated to estimate and design for performance. The current approach is to characterize the channel inclusive of an analog-portion of the buffer and then convolve the impulse-response of the channel with a bit-stream to obtain simulated waveforms. However, current channel-simulation is limited to two-wire differential lanes where each bit is taken as differential-signal. It may be of interest to seek a channel simulation process to provide for chord-simulation for signal integrity analysis on a multi-wire channel where data is taken as an ensemble of single-ended bits transmitted across multiple wires and received bits are operated mathematically to receive a simulated output.

SUMMARY OF INVENTION

In one or more embodiments of the present disclosure, a method is provided. The method may include receiving, at one or more computing devices, an electronic circuit design including at least one channel. The method may further include transmitting two or more inputs from two or more transmitter drivers on two or more wires associated with the electronic circuit design to the at least one channel. In some embodiments, the two or more inputs may be distributed across the two or more wires based upon, at least in part, a chordal code. The method may also include generating two or more simulated waveforms based upon, at least in part, the two or more inputs. The method may further include transmitting the two or more simulated waveforms from the at least one channel on the two or more wires to a comparator block associated with the electronic circuit design. The method may also include comparing the two or more simulation waveforms at the comparator block to produce two or more simulated outputs. The method may further include transmitting the two or more simulated outputs from the comparator block on the two or more wires to two or more post-comparator receivers associated with the electronic circuit design.

One or more of the following features may be included. The method may also include transmitting the two or more simulated waveforms from the at least one channel on the two or more wires to two or more pre-comparator receivers associated with the electronic circuit design and transmitting the two or more simulated waveforms from the two or more pre-comparator receivers on the two or more wires to the comparator block. In some embodiments, the two or more pre-comparator receivers may each include at least one pre-comparator Input-Output Buffer Information Specification Algorithmic Modeling Interface (IBIS-AMI) model. In some embodiments, the at least one pre-comparator AMI model may be disposed to model equalization. In some embodiments, the two or more post-comparator receivers may each include at least one post-comparator IBIS-AMI model. In some embodiments, the at least one post-comparator IBIS-AMI model may be disposed to model eye-calculation. In some embodiments, the at least one pre-comparator IBIS-AMI model may be responsive to the at least one post-configurator IBIS-AMI model. The method may further include generating at least one impulse response of the at least one channel and convolving the at least one impulse response with the two or more inputs to produce the two or more simulated waveforms. In some embodiments, the comparator block may be configured by a user. In some embodiments, the two or more inputs may be singled-ended signals. In some embodiments, the two or more simulated outputs may include one simulated output for each input of the two or more inputs. The method may also include defining a plurality of relationships between two or more inputs of the comparator block and the two or more simulated outputs.

In one or more embodiments of the present disclosure, a system may include a computing device having at least one processor configured to receive an electronic circuit design including at least one channel. The at least one processor may be further configured to transmit two or more inputs from two or more transmitter drivers on two or more wires associated with the electronic circuit design to the at least one channel. In some embodiments, the two or more inputs may be distributed across the two or more wires based upon, at least in part, a chordal code. The at least one processor may also be configured to generate two or more simulated waveforms based upon, at least in part, the two or more inputs. The at least one processor may be further configured to transmit the two or more simulated waveforms from the at least one channel on the two or more wires to a comparator block associated with the electronic circuit design. The at least one processor may also be configured to compare the two or more simulated waveforms on the two or more wires at the comparator block to produce two or more simulated outputs. The at least one processor may be further configured to transmit the two or more simulated outputs from the comparator block on the two or more wires to two or more post-comparator receivers associated with the electronic circuit design.

One or more of the following features may be included. The at least one processor may be further configured to transmit the two or more simulated waveforms from the at least one channel on the two or more wires to two or more pre-comparator receivers associated with the electronic circuit design and transmit the two or more simulated waveforms from the two or more pre-comparator receivers on the two or more wires to the comparator block. In some embodiments, the two or more pre-comparator receivers may each include at least one pre-comparator IBIS-AMI model. In some embodiments, the at least one pre-comparator IBIS-AMI model may be disposed to model equalization. In some embodiments, the two or more post-comparator receivers may each include at least one post-comparator IBIS-AMI model. In some embodiments, the at least one post-comparator IBIS-AMI model may be disposed to model eye-calculation. In some embodiments, the at least one pre-comparator IBIS-AMI model may be responsive to the at least one post-configurator IBIS-AMI model. The at least one processor may also be configured to generate at least one impulse response of the at least one channel and convolve the at least one impulse response with the two or more inputs to produce the two or more simulation waveforms. In some embodiments, the comparator block may be configured by a user.

In one or more embodiments of the present disclosure, a method is provided. The method may include receiving, at one or more computing devices, an electronic circuit design including at least one channel. The method may also include transmitting two or more inputs from two or more transmitter drivers on two or more wires associated with the electronic circuit design to the at least one channel. In some embodiments, the two or more inputs may be distributed across the two or more wires based upon, at least in part, a chordal code. The method may further include generating two or more simulated waveforms based upon, at least in part, the two or more inputs. The method may also include transmitting the two or more simulated waveforms from the at least one channel on the two or more wires to two or more pre-comparator receivers associated with the electronic circuit design. In some embodiments, the two or more pre-comparator receivers may each include at least one pre-comparator IBIS-AMI model. The method may further include transmitting the two or more simulated waveforms from the two or more pre-comparator receivers on the two or more wires to a comparator block associated with the electronic circuit design. The method may also include comparing the two or more simulation waveforms at the comparator block to produce two or more simulated outputs. The method may further include transmitting the two or more simulated outputs from the comparator block on the two or more wires to two or more post-comparator receivers associated with the electronic circuit design. In some embodiments, the two or more post-comparator receivers may each include at least one post-comparator IBIS-AMI model.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 10 is a diagram of an input matrix produced in an embodiment incorporating channel simulation process in accordance with the present disclosure;

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Figure 1:
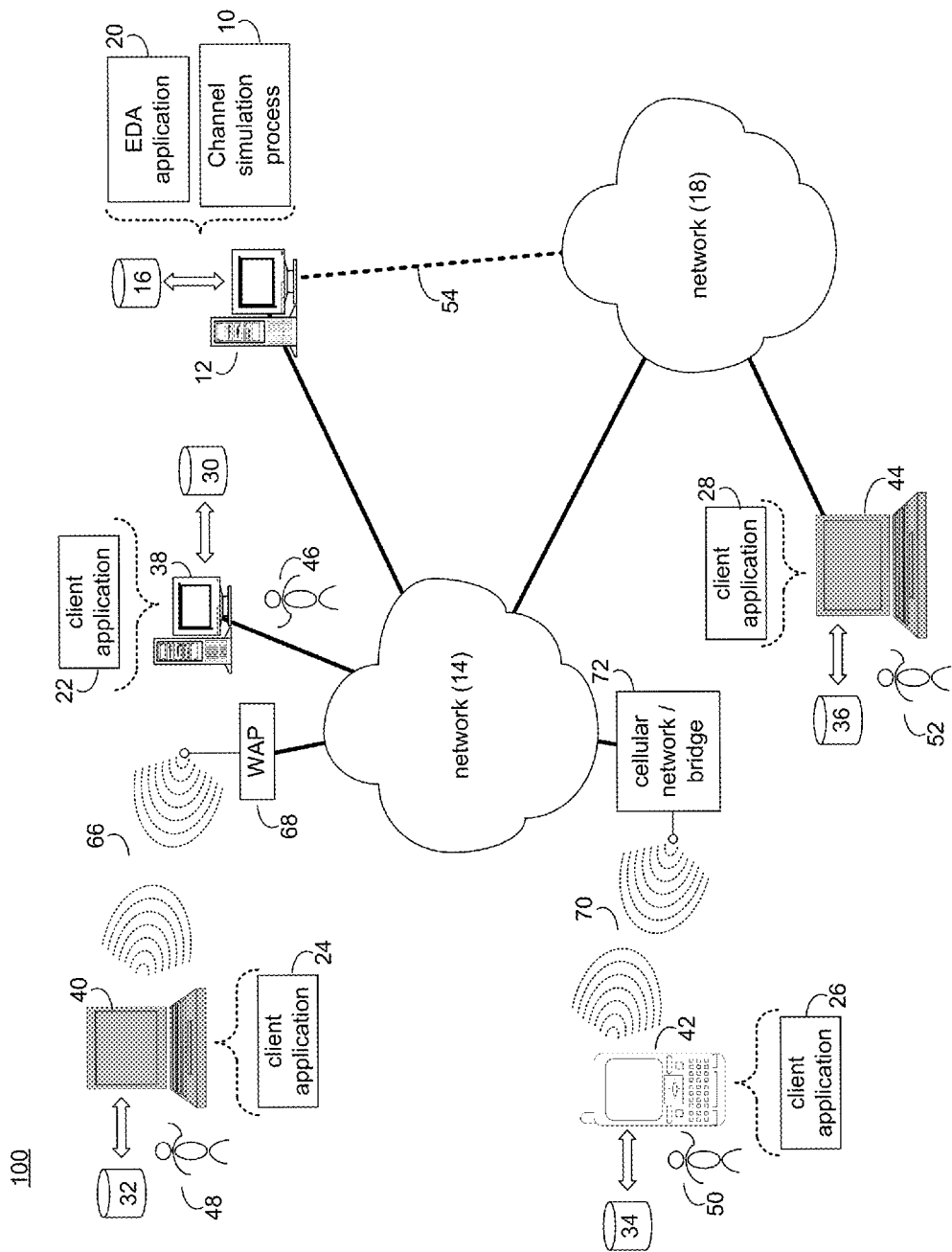
FIG. 1 is a system diagram depicting aspects of the channel simulation process in accordance with an embodiment of the present disclosure.

Referring to FIG. 1, there is shown channel simulation process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the channel simulation process may reside on and be executed, in whole or in part, by a client electronic device, such as a personal computer, notebook computer, personal digital assistant, or the like.

The instruction sets and subroutines of channel simulation process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Channel simulation process 10 may be a stand-alone application, or may be an applet/application/script that may interact with and/or be executed within EDA application 20. In addition/as an alternative to being a server-side process, the channel simulation process may be a client-side process (not shown) that may reside on a client electronic device (described below) and may interact with an EDA client application (e.g., one or more of EDA client applications 22, 24, 26, 28). Further, the channel simulation process may be a hybrid server-side/client-side process that may interact with EDA application 20 and an EDA client application (e.g., one or more of client applications 22, 24, 26, 28). As such, the channel simulation process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize channel simulation process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
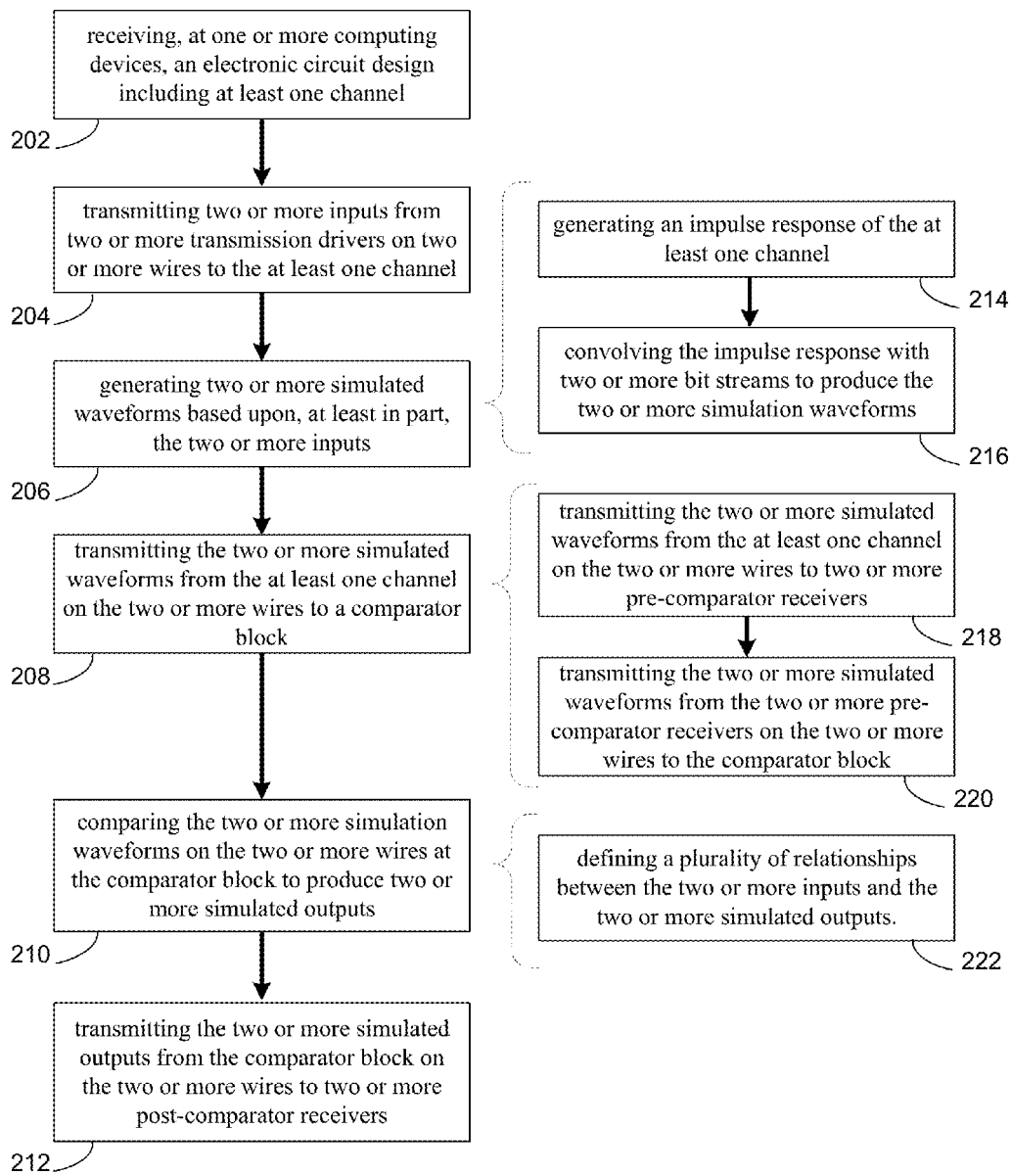
FIG. 2 is a flowchart depicting operations consistent with the channel simulation process of the present disclosure.

Referring to FIGS. 2-12, various embodiments consistent with channel simulation process 10 are provided. As shown in FIG. 2, embodiments of channel simulation process 10 may include receiving (202), at one or more computing devices, an electronic circuit design including at least one channel. Embodiments may further include transmitting (204) two or more inputs from two or more transmitter drivers on two or more wires associated with the electronic circuit design to the at least one channel. Embodiments may also include generating (206) two or more simulated waveforms based upon, at least in part, the two or more inputs. Embodiments may further include transmitting (208) the two or more simulated waveforms from the at least one channel on the two or more wires to a comparator block associated with the electronic circuit design. Embodiments may further include comparing (210) the two or more simulated waveforms at the comparator to produce two or more simulated outputs. Embodiments may further include transmitting (212) the two or more simulated outputs from the comparator block on the two or more wires to two or more post-comparator receivers associated with the electronic circuit design.

As will be discussed in greater detail below, in some embodiments, generating (206) the two or more simulated waveforms may include generating (214) at least one impulse response of the at least one channel and convolving (216) the at least one impulse response with the two or more inputs to produce the two or more simulation waveforms. In some embodiments, transmitting (208) the two or more simulated waveforms from the at least one channel may include transmitting (218) the two or more simulated waveforms from the at least one channel on the two or more wires to two or more pre-comparator receivers and/or transmitting (220) the two or more simulated waveforms from the two or more pre-comparator receivers on the two or more wires to the comparator block. In some embodiments, comparing (210) the two or more simulation waveforms may include defining (222) a plurality of relationships between the two or more inputs and the two or more simulated outputs.

In some embodiments, channel simulation process 10 may include receiving (202), at one or more computing devices, an electronic circuit design including at least one channel. In some embodiments, the electronic circuit design may be received from a graphical user interface (GUI). In one example, channel simulation process 10 may be used in conjunction with the EDA application. The electronic circuit design may be received from the EDA application and/or channel simulation process 10 may be executed within or executed concurrently with an EDA application. An electronic circuit design as used herein may include, but is not limited to, a representation of an electronic circuit that may be designed, simulated, tested, and/or verified to enable an electronic circuit to carry out one or more instructions, as is known in the art. A channel as used herein may include, but is not limited to, a printed circuit board (PCB) interconnect, a package interconnect, and/or a housing and a plurality of terminals that may be used to connect electronic circuit components containing a conductive pattern that may be printed on the surface of an insulating base, as is known in the art.

In some embodiments, channel simulation process 10 may be used by system designers to design, simulate, test, and/or verify a channel associated with an electronic circuit design. In other words, channel simulation process 10 may simulate a channel within an electronic circuit design. Within an electronic circuit design, models for input-output (IO) buffers between electronic components may be necessary to allow system designers to simulate channels to estimate and design for performance. However, IO designers may not give original IO-netlists as this may be their intellectual property and IO-netlists may take a long time to simulate. Additionally, proprietary EDA applications may accurately model their own electronic components, but they may not model components from different EDA application vendors. Channel simulation process 10 may include simulating at least one channel associated with an electronic circuit design. Design components that are "associated with the electronic circuit design" as used herein may include, but are not limited to, design components of an electronic circuit design that are represented within an EDA. These design components may be software representations of hardware components used in the simulation of an electronic circuit design. In other words, channel simulation process 10 may describe the modeling and simulation of a channel through software (e.g., an EDA in combination with channel simulation process 10).

Figure 3:
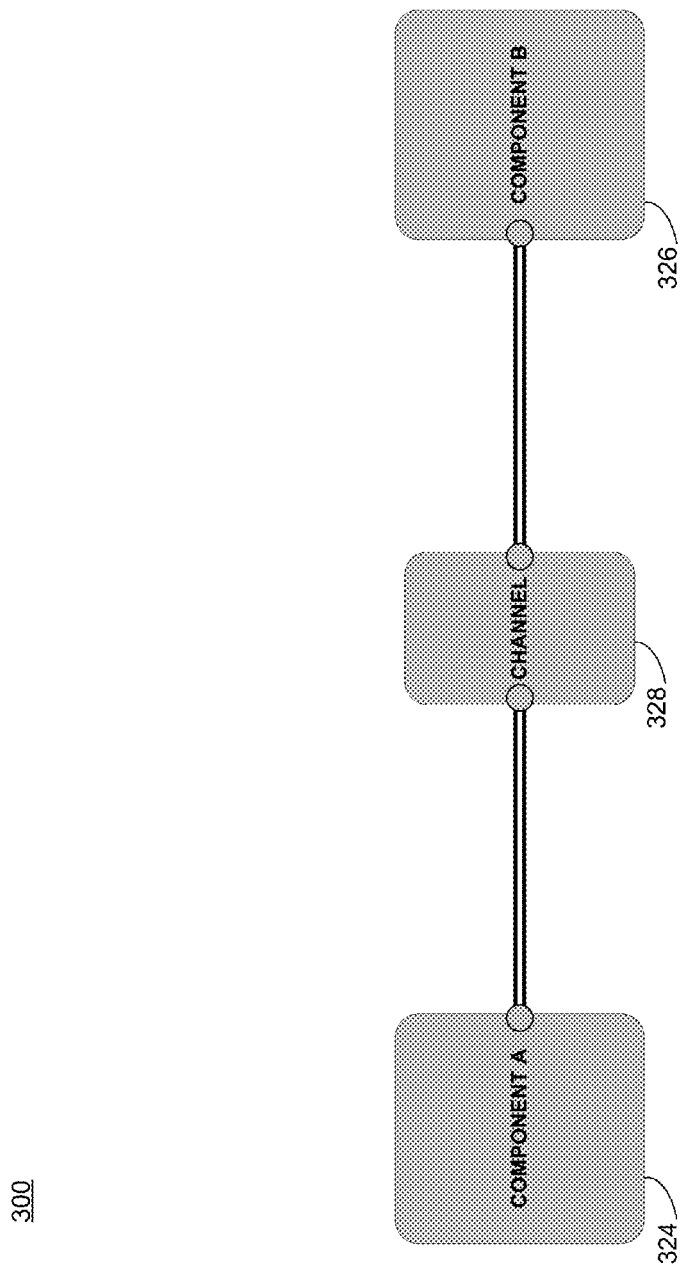
FIG. 3 is a schematic depicting a channel associated with an electronic circuit design in accordance with an embodiment of the present disclosure.

In one example and as shown in FIG. 3, an electronic circuit design may include two electronic components 324, 326 connected by and/or through a channel 328. Component A 324 and Component B 326 may each represent one or more electronic components in at least a portion of an electronic circuit design. Component A 324 and Component B 326 may each and/or individually include netlists (i.e., description of the connectivity of the electronic component) which may be intellectual property. Further, Component A 324 and Component B 326 may include complicated portions of the electronic circuit design that would take a considerable time to simulate. However, it is possible to simulate and model these channels without simulating the entire circuit and/or revealing component netlists through the use of Input-output Buffer Information Specification (IBIS) models for Single-Ended IO-buffers and/or through the use of IBIS-Algorithmic Modeling Interface (AMI) models for Differential IO-buffers (i.e., serial links).

IBIS models as used herein may include, but are not limited to, behavioral models that may describe the electrical characteristics of a channel based upon the application of one or more inputs to a channel and the corresponding outputs, as is known in the art. An IBIS model may include tabular data of current and voltage values based upon applied inputs and received outputs, as well as the voltage and time relationship observed at the output under rising or falling switching conditions. In some embodiments, IBIS models may be used for signal integrity analysis of an electronic circuit design. IBIS models may allow system designers to simulate and determine signal integrity concerns in a channel that connects different electronic circuit components. Signal integrity problems that may be determined with an IBIS model include, but are not limited to, mismatched impedance in the channel, crosstalk, ground and power bounce, overshoot, undershoot, line termination analysis, etc. IBIS models may be created by many different methods known in the art.

In some embodiments, IBIS-AMI models as used herein may include, but are not limited to, IBIS models that include an algorithmic modeling interface (AMI). IBIS-AMI models may enable fast, accurate statistical and/or time-domain simulations of high-speed channels. IBIS-AMI models combine IBIS modes and AMI models. As discussed above, IBIS models may model transmitter driver strength and receiver front-end termination along with pad-capacitances. An AMI model as used herein may include, but is not limited to, a C/C++ model that may model equalization of a serial-link IO buffer. AMI models may also model gain control and clock and data recovery modules of a serial link and/or channel.

In some embodiments, channel simulation process 10 may allow one or more modes of simulation supported by the IBIS-AMI standard (e.g., IBIS Version 6.0) including, but not limited to, statistical analysis and time domain simulation. Statistical analysis as used herein may include, but is not limited to, generating the channel's end to end impulse response to and using convolution techniques to generate one or more of eye diagram statistics, bathtub curves, and a bit-error-rate (BER). In one example, the BER may be estimated by combining bathtub curves with estimated recovered clock behavior. In some embodiments, statistical analysis may include peak distortion analysis to determine the worst case data pattern and a corresponding eye diagram closure. The IBIS-AMI modeling approach may break Serializing-Deserializing (SERDES) device modeling into two parts, electrical and algorithmic. The combination of a transmitter driver's analog back-end, the channel and the receiver's analog front-end may be assumed to be linear and time invariant (LTI). The equalization performed by the transmitter and/or the receiver may be LTI. In some embodiments, the "analog" portion of the channel may be characterized by means of an impulse response leveraging the IBIS constructs for device models.

As described above and in some embodiments, IBIS models may be used for Single-Ended IO-buffers and IBIS-AMI models may be used for Differential IO-buffers. In some embodiments, single-ended IO-buffers may be used for single-ended signaling of the inputs and outputs of a channel. Single-ended signaling as used herein may include, but is not limited to, transmission of a signal across two conductors (e.g., wires, or traces in an electronic circuit) where one conductor may carry an applied voltage and the other conductor may carry a reference voltage or ground, as is known in the art. Advantages of single-ended signaling may include, but are not limited to, a lower implementation expense compared to differential signaling and signal-ended signaling may require fewer wires than differential signaling. For example, to transmit n signals, n+1 wires may be needed for single-ended signaling (e.g., one bit may require two wires but two bits may require three wires). Disadvantages of single-ended signaling may include, but are not limited to, an inability to filter noise and potential induction between two or more wires.

In some embodiments, differential IO-buffers may be used for differential signaling of the inputs and outputs of a channel. Differential signaling as used herein may include, but is not limited to, transmitting the same signal as a differential pair of signals, each in its own wire, as is known in the art. The receiving circuit may respond to the electrical difference between the two signals, rather than the difference between an applied voltage on a single wire and a reference voltage. In differential signaling, one bit may be transferred on two wires. Advantages of differential signaling may include, but are not limited to, noise cancelling and power efficiency. Disadvantages of differential signaling may include, but are not limited to, the need for more wires to transmit signals than required for single-ended signaling. For example, to transmit n signals, 2n wires (e.g., n signals multiplied by 2) may be needed for differential signaling (e.g., one bit may requires two wires but two bits may require four wires where each additional bit may require an independent pair of wires).

Figure 4:
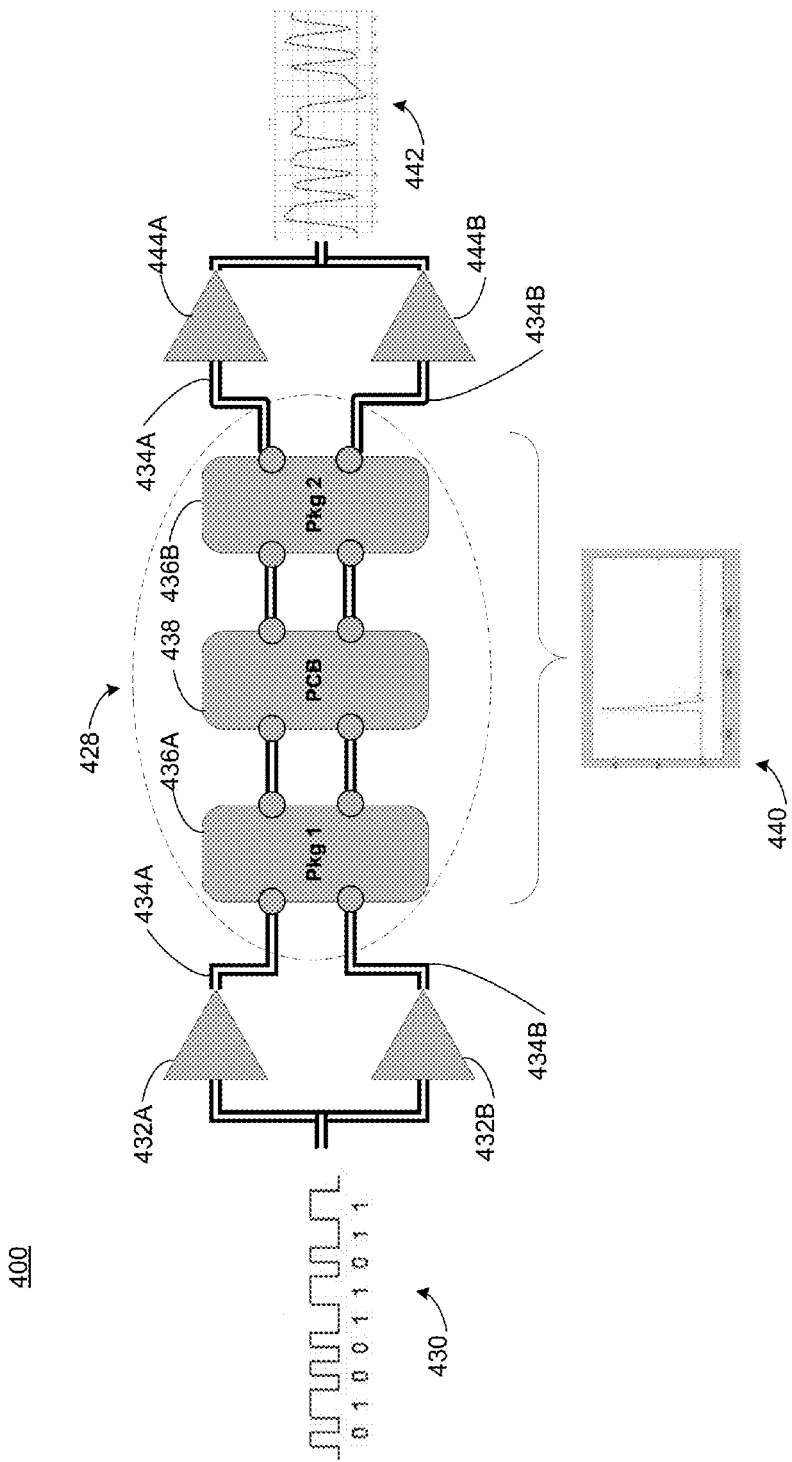
FIG. 4 is a diagram depicting an embodiment incorporating channel simulation process in accordance with the present disclosure.

In one example and referring also to FIG. 4, a channel may be simulated using differential signaling. In this example, a single differential bit 430 (e.g., a bit stream and/or a signal) may be transmitted from two transmitter drivers 432A, 432B on two wires 434A, 434B to the at least one channel 428. The single differential bit 430 may be distributed across the two wires 434. The at least one channel 428 may include one or more interconnect packages 436A, 436B and/or a PCB 438. As will be discussed in greater detail below, the channel 428 may be modeled by generating an impulse response 439 representative of the at least one channel 428. The impulse response 440 of the at least one channel 428 may be convolved with the single differential bit 430 and/or a unique bit stream (not shown) to generate a simulated waveform 442 based upon, at least in part, the single differential bit 430. In this example, a single differential bit 430 is applied and two wires 434A, 434B are required to generate the simulated waveform 442 received at two receivers 444A, 444B. However, differential signaling may be limited to transmitting a single differential bit. Furthermore, differential signaling may not support simulation of topologies that transmit two or more bits across multiple wires and subsequently recover them.

In some embodiments and as will be described in greater detail below, channel simulation process 10 may use chord-signaling. Chord-signaling as used herein may include, but is not limited to, the transmission of a bit-ensemble (e.g., a group of single-ended signals or bits) across multiple wires. In some embodiments, chord-signaling may use a chordal code for transmission and detection of signals on multiple wires. A chordal code as used herein may include, but is not limited to, a chordal codebook and one or more comparators. The chordal codebook, as used herein, may include, but is not limited to, a first set of vectors of the same length as the number of wires. For example, for differential signaling, the chordal codebook may consist of two-dimensional vectors for the two wires. The vectors in a chordal codebook may correspond to values that are simultaneously transmitted on the two or more wires. For example, for differential signaling the chordal codebook may consist of the two vectors $[+1,-1]$ and $[-1,+1]$. In other words, the values on the two wires in a differential signaling example may be complementary. One or more comparators as used herein may include, but are not limited to, a second set of vectors of the same length as the number of wires. As will be discussed in greater detail below, the comparators may determine the sign of the inner product of the vector representing the comparator with the wire-values (e.g., "+" or "−"). For example, for differential signaling there may be only one comparator given by the vector $[1,-1]$.

In some embodiments, chord-signaling may include conducting serial communication through a bit-ensemble that travels on multi-wire channel instead of a single bit on a single differential channel. In chord-signaling, the output bits at the receive-end of the channel may be mathematically operated to get the desired final outputs. Channel simulation process 10 may model and simulate such an ensemble of bits (single-ended multiple-bits as against differential-single-bit) travelling through a multi-wire channel. As will be discussed in greater detail below, channel simulation process 10 may provide an industry solution to do signal-integrity analysis of multi-wire chord signals using standard IBIS/AMI models.

Figure 5:
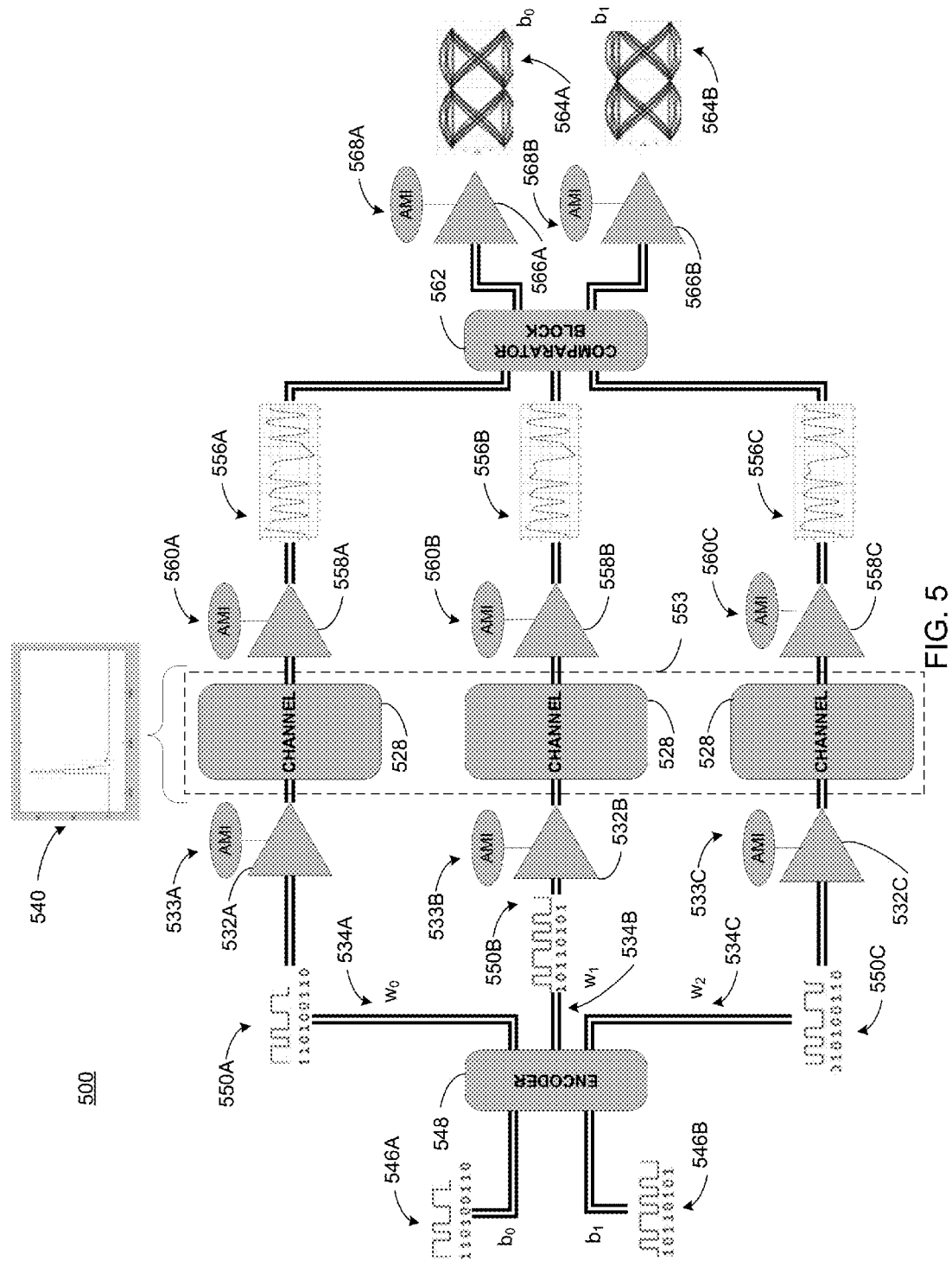
FIG. 5 is a schematic depicting an embodiment incorporating channel simulation process in accordance with the present disclosure.

In one example and as shown in FIG. 5, channel simulation process 10 may receive two or more inputs 546A, 546B (e.g., bits, bit streams, bit-ensembles, and/or signals). While FIG. 5 includes two inputs 546A, 546B, any number of inputs is within the scope of the present invention. In some embodiments, the two or more inputs 546A, 546B may be provided by a user (e.g., through a graphical user interface), the inputs 546A, 546B may be default inputs stored within channel simulation process 10, the inputs 546A, 546B may be provided by an EDA application, and/or they may be generated by channel simulation process 10. In some embodiments, the two or more inputs 546A, 546B may be synthesized pseudo random bit sequences. In one example, the two or more inputs 546A, 546B may be single-ended signals. In some embodiments, the two or more inputs 546A, 546B may be received at an encoder 548. The encoder may distribute the two or more inputs 546A, 546B across the two or more wires 534A, 534B, 534C based upon, at least in part, a chordal code as two or more distributed inputs.

In some embodiments, channel simulation process 10 may include transmitting (204) the two or more inputs (e.g., in the form of distributed inputs) from two or more transmitter drivers on the two or more wires associated with the electronic circuit design to the at least one channel. A transmitter driver 532A, 532B, 532C as used herein may include, but is not limited to, an electronic component associated with an electronic circuit design that may drive an input through a channel. In some embodiments, a transmitter driver 532A, 532B, 532C may include a driver impedance and a driver edge rate. In some embodiments, the two or more transmitter drivers may each include at least one IBIS-AMI model.

Figure 6:
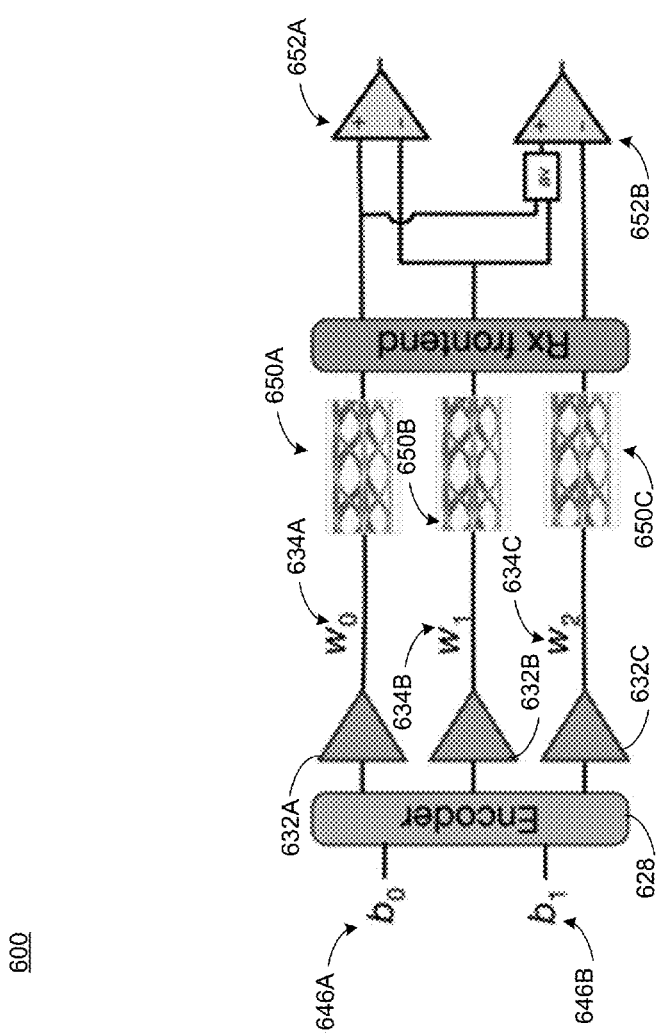
FIG. 6 is a diagram depicting an embodiment incorporating chord signaling in accordance with the present disclosure.

In some embodiments and referring also to FIG. 6, channel simulation process 10 may distribute the two or more inputs 646A, 646B across two or more wires, $w_0$ 634A, $w_1$ 634B, $w_2$ 634C associated with an electronic circuit design. In some embodiments, the two inputs 646A, 646B may be transmitted to the at least one channel 628 based upon a chordal code. In one example, an encoder 648 may be used to distribute the two or more inputs [b0, b1] 646A, 646B across the two or more wires 634A, 634B, 634C as two or more distributed inputs 650A, 650B, 650C. The choral codebook may include vectors ±[1,0,−1] and ±[0,1,−1], so there may be four code words (e.g., 2 bits) transmitted on three wires. As will be discussed in greater detail below, there may be two comparators 652A, 652B. The first comparator 652A may compare the bit on $w_0$ 634A and the bit on $w_1$ 634B and the second comparator 652B may compare the bit on $w_2$ 634C with the average of the bits on $w_0$ 534A and $w_1$ 534B. The first comparator 652A may evaluate to values ±1 and the second comparator 652B may evaluate to values ±1.5.

In some embodiments, the two or more inputs may be transmitted to at least one channel. In one example, a copy of the channel may be instantiated for each wire and may receive the two or more inputs from one of the wires. In another example, a unique and/or different channel may be instantiated for each wire and may receive the two or more inputs from at least one of the wires. Combinations of copies of a single channel and unique and/or different channels are within the scope of the present disclosure. In some embodiments and as will be discussed in greater detail below, there may be cross-talk between the two or more wires. For example and as shown in FIG. 5, a dashed line rectangle 553 is provided around the at least one channel to represent the potential for cross-talk between the wires/single-bit lanes.

In some embodiments, channel simulation process 10 may include generating (206) two or more simulated waveforms based upon, at least in part, the two or more inputs. In some embodiments, the simulated waveforms may represent the output of the at least one channel based upon, at least in part, the two or more inputs. In some embodiments, channel simulation process 10 may include generating (214) at least one impulse response 540 of the at least one channel 528. In some embodiments, the channel may be an analog channel. Each channel may be exercised by an EDA (e.g., Simulation Program with Integrated Circuit Emphasis (SPICE)) to produce an impulse response 540. In some embodiments, the impulse response 540 of the at least one channel 528 may be derived from direct S-parameter simulation of the at least one channel 528. In some embodiments, the impulse response 540 may be derived from a step response of the at least one channel 528, which may then differentiated to produce an impulse response 540. In some embodiments, impulse-response generation may be a separate process from the injection of the two or more inputs (e.g., bit-stream) to generate the two or more simulated waveforms.

In some embodiments, generating an impulse response 540 of the at least one channel 528 may include characterizing the channel for multi-wire signaling. In some embodiments, the two or more inputs 546A, 546B may be chord-signals (e.g., multiple single-ended signals) and may be characterized through a standard cross-talk multiple input multiple output (MIMO) model. Channel simulation process 10 may include stimulating each of the two or more transmitter drivers 532A, 532B, 532C with an impulse signal and/or a step signal. In some embodiments, one transmitter driver may be stimulated at a time. A resulting impulse and/or step response may be observed at each channel output due to cross-talk between the two or more wires.

Figure 7:
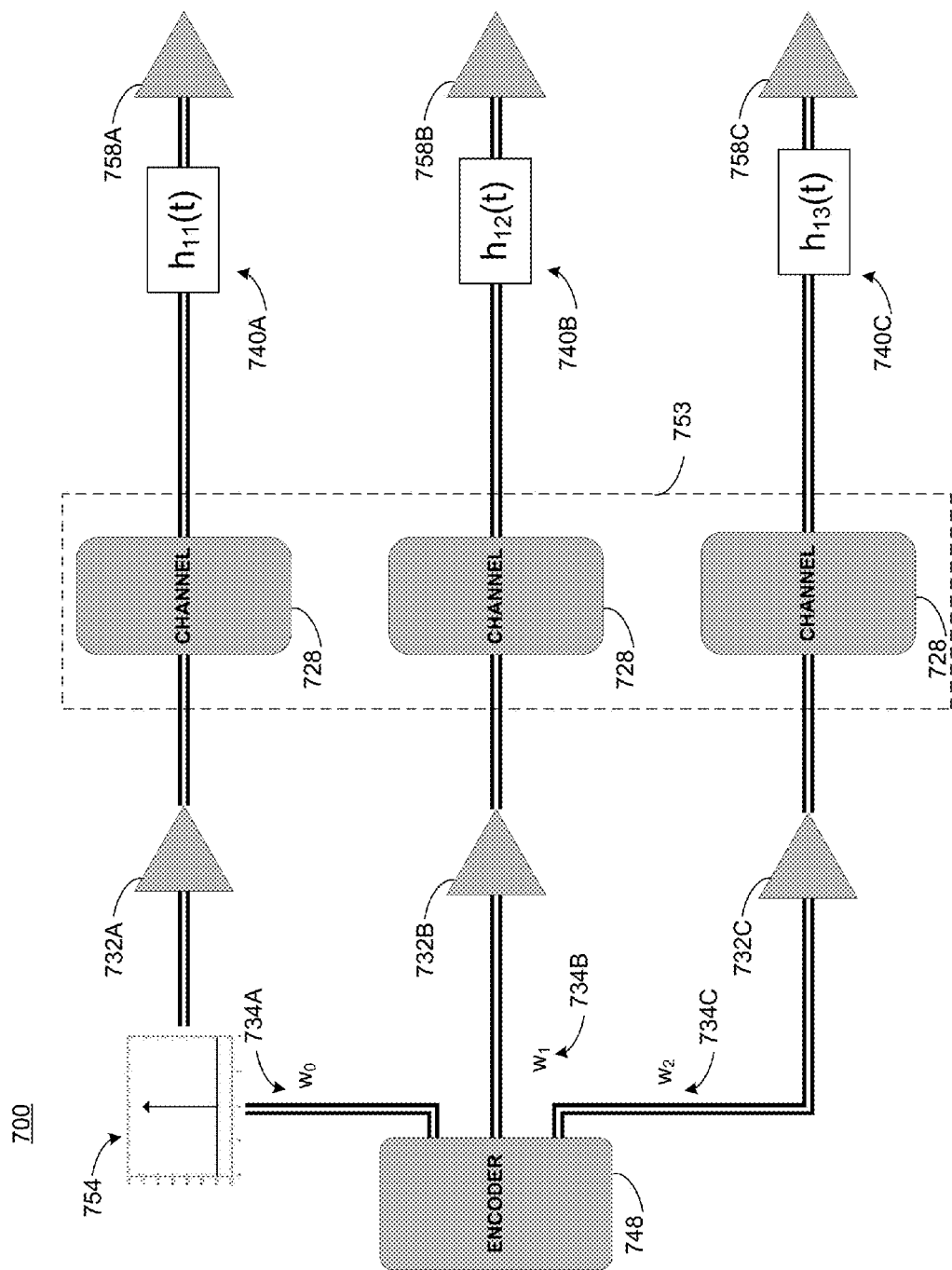
FIG. 7 is a schematic depicting an embodiment incorporating channel simulation process in accordance with the present disclosure.
Figure 8:
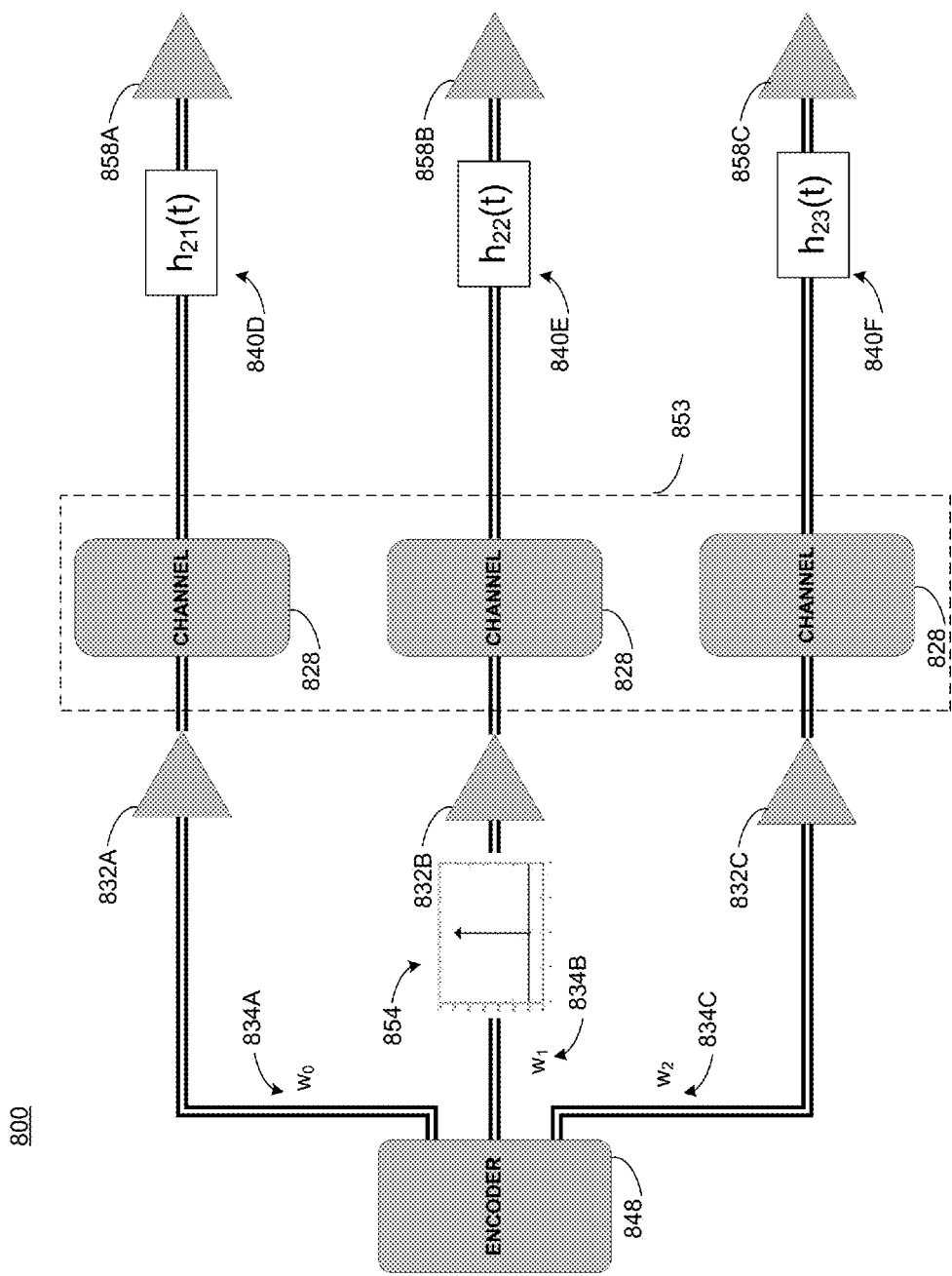
FIG. 8 is a diagram depicting an embodiment incorporating channel simulation process in accordance with the present disclosure.
Figure 9:
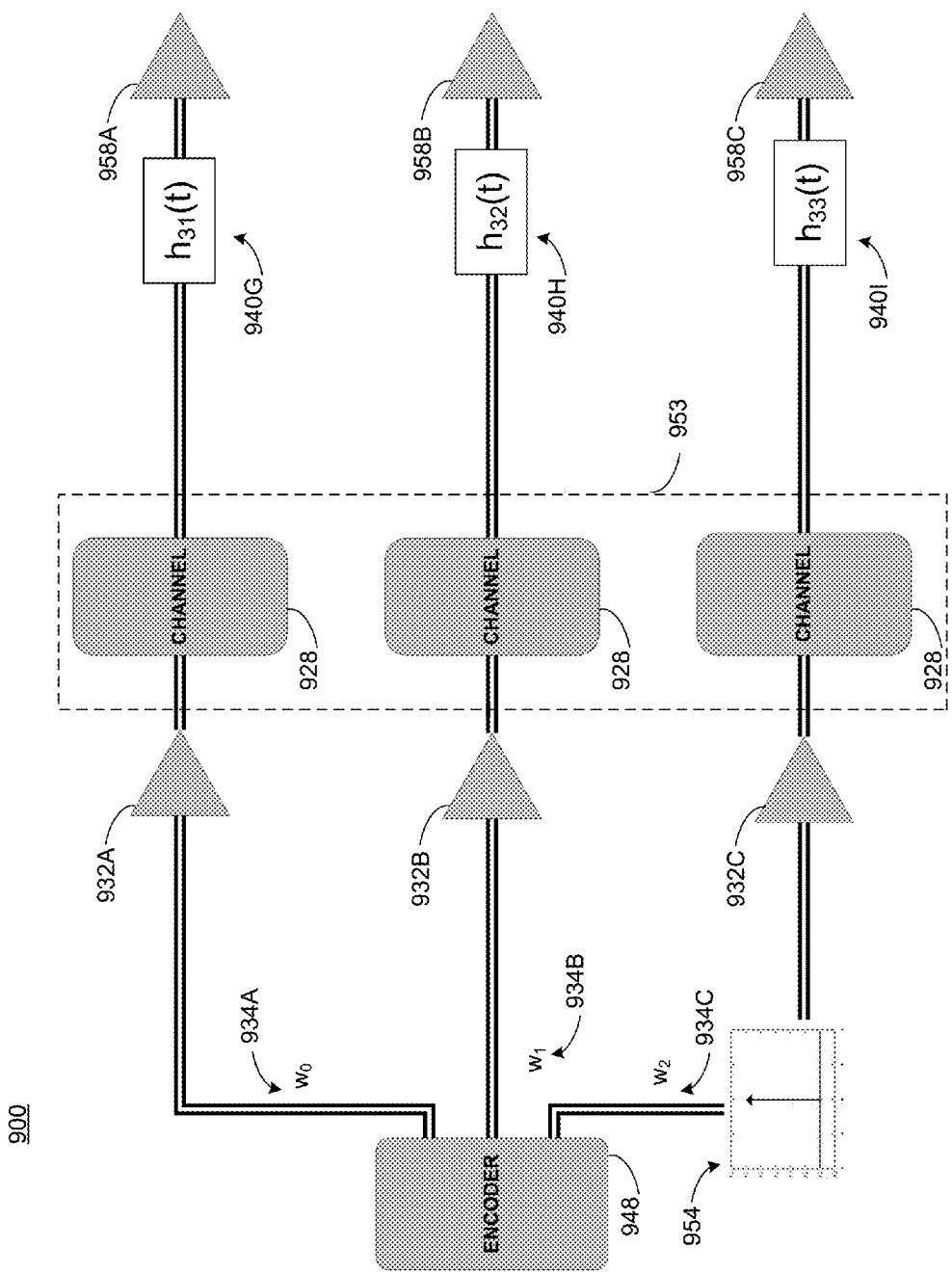
FIG. 9 is a schematic depicting an embodiment incorporating channel simulation process in accordance with the present disclosure.

In some embodiments and as shown in FIGS. 7-10, an impulse function and/or signal may be applied to each transmitter driver of the three transmitter drivers 732A, 732B, 732C in an exemplary system. Referring now to FIG. 7, an impulse function 754 and/or signal may be applied to a transmitter driver 732A associated with a first wire (e.g., wire $w_0$ 734A). A resulting impulse response $h_{11}(t)$ 740A may be observed on wire $w_0$ 734A, where $h_{ij}(t)$ may denote an impulse response from the ith transmitter driver to the jth receiver. Impulse responses $h_{12}(t)$ 740B on wire $w_1$ 734B and $h_{13}(t)$ 740C on wire $w_2$ 734C may also be observed in response to the impulse function applied to the transmitter driver 732A associated with the wire $w_0$ 732A. Referring also to FIG. 8, an impulse function 854 may be applied to a transmitter driver 832B associated with a second wire (e.g., wire $w_1$ 834B) with resulting impulse responses $h_{21}(t)$ 840D observed on wire $w_0$ 834B, $h_{22}(t)$ 840E observed on wire $w_1$ 834B, and $h_{23}(t)$ 840F observed on wire $w_2$ 834C. Referring also to FIG. 9, an impulse function 954 may be applied to a transmitter driver 932C associated with a third wire (e.g., wire $w_2$ 934C) with resulting impulse responses $h_{31}(t)$ 940G observed on wire $w_0$ 934A, $h_{32}(t)$ 940H observed on wire $w_1$ 934B, and $h_{33}(t)$ 940I observed on wire $w_2$ 934C.

In some embodiments and referring also to FIG. 10, resulting impulse responses, similar to those from the above examples of FIG. 7-9, may be represented by an impulse matrix, where $h_{ij}(t)$ may denote an impulse response from the ith transmitter driver to the jth receiver. The impulse matrix may be similar to that of a MIMO system.

In some embodiments and referring again to FIG. 5, channel simulation process 10 may include convolving (216) the impulse response 540 with two or more inputs to produce the two or more simulation waveforms. In some embodiments, convolving the impulse response 540 may include convolving each impulse response 740A, 740B, 740C, 840D, 840E, 840F, 940G, 940H, 940I in the impulse matrix. In some embodiments, the impulse response 540 may be convolved with a different set of bit streams. In other words, the impulse response may be convolved by a signal other than the two or more inputs. In some embodiments, the channel may be, or may be assumed to be, a linear, time-invariant (LTI) system with a channel matrix H convolved with an input matrix X to generate an output matrix Y represented by Equation 1:

$$Y = H * X \qquad (1)$$

Additionally and/or alternatively, the system may be represented by Equation 2 where $y_n$ may represent the simulated waveform for the convolution of each impulse response, $h_{nm}$ and $x_m$, where $h_{nm}$ may denote impulse responses from the nth transmitter driver to the mth receiver and $x_m$ may denote the input at the mth receiver.

$$y_n = \sum_{m=1}^{n} h_{nm} x_m \qquad (2)$$

In some embodiments and referring again to FIG. 5, channel simulation process 10 may include transmitting (218) the two or more simulated waveforms 556A, 556B, 556C from the at least one channel 528 on the two or more wires 534A, 534B, 534C to two or more pre-comparator receivers 558A, 558B, 558C associated with the electronic circuit design. The pre-comparator receivers 558A, 558B, 558C may also be referred to as the frontend receivers or "Rx" frontends. In some embodiments, there may be a pre-comparator receiver 558A, 558B, 558C for each wire of the two or more wires 534A, 534B, 534C associated with the electronic circuit design. In some embodiments, each of the pre-comparator receivers 558A, 558B, 558C may include a slicer and a decoder. As discussed above, in some embodiments, the two or more pre-comparator receivers 558A, 558B, 558C may be a single-ended receiver IO-buffers, differential receiver IO-buffers, and/or any IO-buffer known in the art. In some embodiments, the two or more pre-comparator receivers 558A, 558B, 558C may each include a pre-comparator IBIS-AMI model 560A, 560B, 560C. In some embodiments, the IBIS portion of the IBIS-AMI model may be disposed to operate on each bit of the simulated waveform to model the receiver analog portion of the channel. In some embodiments, the AMI portion of the IBIS-AMI model may be disposed to operate on each bit of the simulated waveform to model adaptation of an equalization circuit (e.g., of the IO-buffer). In some embodiments, and as will be discussed in greater detail below, the AMI portion of the IBIS-AMI model may be disposed to operate on each bit of the simulated waveform to model adaptation of the equalization circuit in response to simulated outputs received at the output of two or more post-comparator receivers. In other words, the pre-comparator IBIS-AMI model of the two or more pre-comparator receivers may be responsive to the one or more simulated outputs of the two or more post-comparator receivers.

In some embodiments and as shown in at least FIG. 5, channel simulation process 10 may include transmitting (220) the two or more simulated waveforms 556A, 556B, 556C from the two or more pre-comparator receivers 558A, 558B, 558C on the two or more wires 534A, 534B, 534C to a comparator block 562 associated with the electronic circuit design. In some embodiments, channel simulation process 10 may include transmitting (208) the two or more simulated waveforms 556A, 556B, 556C from the at least one channel 528 on the two or more wires 534A, 534B, 534C to the comparator block 562 associated with the electronic circuit design. In other words, the two or more simulated waveforms 556A, 556B, 556C may be transmitted from the at least one channel 528 to the comparator block 562 without first being received at and transmitted from the two or more pre-comparator receivers 558A, 558B, 558C.

In some embodiments, channel simulation process 10 may include comparing (210) the two or more simulated waveforms 556A, 556B, 556C on the two or more wires 534A, 534B, 534C at the comparator block 562 to produce two or more simulated outputs 564A, 564B. A comparator block or chord comparator block 562, may be introduced after the at least one channel to complete math operations on the simulated waveforms 556A, 556B, 556C transmitted from the pre-comparator receivers 558A, 558B, 558C and/or channel 528 to produce two or more simulated outputs 564A, 564B. A simulated output as used herein may include, but is not limited to, an eye diagram or points of an eye diagram associated with two or more inputs 546A, 546B. As described above, the two or more simulated outputs 564A, 564B may be used to model the channel based upon, at least in part, the two or more inputs 546A, 546B applied to the at least one channel 528. In some embodiments, the comparator block 562 may include control sources that may be configured to act as comparators to compare one or more bits over different wires and process the simulated waveforms 556A, 556B, 556C. In one example, three bits, bit0, bit1, and bit2, may be transmitted from three pre-comparator receivers 558A, 558B, 558C on the three wires, $w_0$ 534A, $w_1$ 534B, and $w_2$ 534C, to the comparator block 562. At and/or within the comparator block 562, mathematical operations may be performed on the bits. For example, the comparator block 562 may evaluate the difference between bit0 and bit1 and/or the difference between bit2 and the average of bit0 and bit1. While these operations represent one example of the functionality of the comparator block, any comparing operation, or operations, of the comparator block relationships are within the scope of the present disclosure.

In some embodiments, a comparator block 562 may be configured based upon, at least in part, a chordal code. In some embodiments, the comparator block 562 may be configured by a user to decide which differential signals need to be examined. In some embodiments, the comparator block may be configured by a user to do "what-if" testing. In some embodiments, a user may add the comparator block 562 to an electrical circuit design and assign two or more outputs and two or more inputs associated with the comparator block. In some embodiments, channel simulation process 10 may include defining (222) a plurality of relationships between two or more comparator inputs and the two or more comparator outputs. In some embodiments, the two or more outputs of the comparator block may be the two or more simulated outputs 564A, 564B. In one example, a user may define the relationships between two or more comparator inputs and two or more comparator outputs as shown in Equations 3 and 4 below:

$$V_{outB} = \frac{V_{inB} - V_{inC}}{2} \quad (3)$$

$$V_{outC} = (V_{inA} - V_{inB}) \quad (4)$$

While these relationships represent two examples of user-defined relationships, any user-defined relationship between the outputs and inputs is within the scope of the present disclosure. In some embodiments, the comparator block 562 may be implemented through controlled sources, such as comparators, in/by an EDA such as SPICE. The following is a non-limiting example of an implementation of one or more features and/or functions of channel simulation process 10 for implementing the comparator block 562. Other implementations may be used within the scope of the present disclosure.

erxour1 prim_posout ngnd v='(v(prim_pos,ngnd)+(v
  (xtalk1_pos,ngnd)+v(xtalk2_pos,ngnd))/3)' erxour2 prim_negout ngnd v='v(prim_neg,ngnd)'

In some embodiments, channel simulation process 10 may include transmitting (212) the two or more simulated outputs 564A, 564B from the comparator block 562 on the two or more wires 534A, 534B, 534C to two or more post-comparator receivers 566A, 566B associated with the electronic circuit design. In some embodiments, there may be a post-comparator receiver for each simulated output of the two or more simulated outputs 534A, 534B, 534C associated with the electronic circuit design. In some embodiments, each of the post-comparator receivers 566A, 566B may include a slicer and a decoder. As discussed above, in some embodiments, the two or more post-comparator receivers 566A, 566B may be a single-ended receiver IO-buffers, differential receiver IO-buffers, and/or any IO-buffer known in the art. In some embodiments, the two or more post-comparator receivers 566A, 566B may each include a post-comparator IBIS-AMI model 568A, 568B. The post-comparator IBIS-AMI model, or models, may operate on two or more bits derived from the mathematical operations of the comparator block 562 to model the post-comparator receiver 566A and 566B as high-impedance IBIS-receivers, as may be seen from the comparator block 562. The AMI portion of the post-comparator IBIS-AMI model may model the eye-calculations on the two or more simulated outputs 564A, 564B. An eye diagram or eye-calculation may include features such as eye opening, eye-overshoot/undershoot, eye width, and/or eye-closure. The features of an eye diagram may measure noise, distortions, jitter, and/or other interference in the at least one channel.

Figure 11:
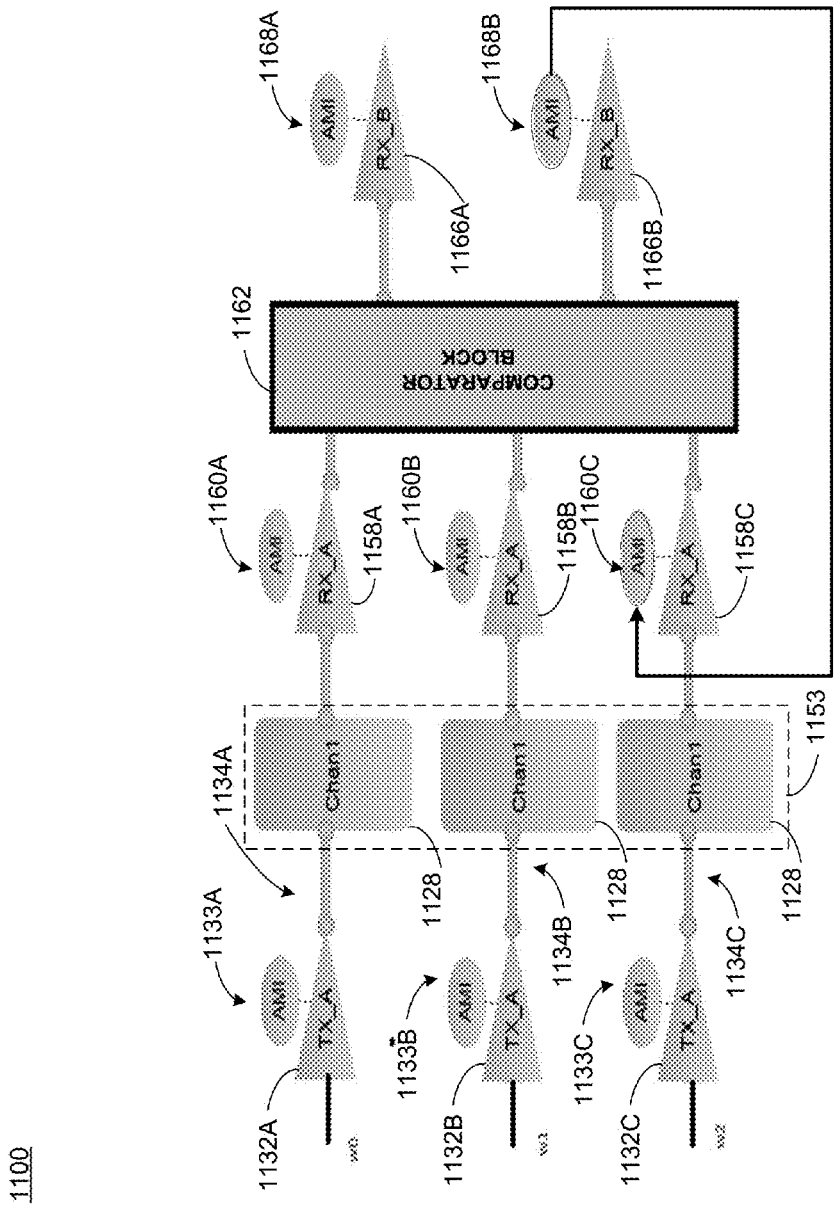
FIG. 11 is a schematic depicting post-comparator IBIS-AMI model and pre-comparator IBIS-AMI model communication incorporating channel simulation process in accordance with the present disclosure.
Figure 12:
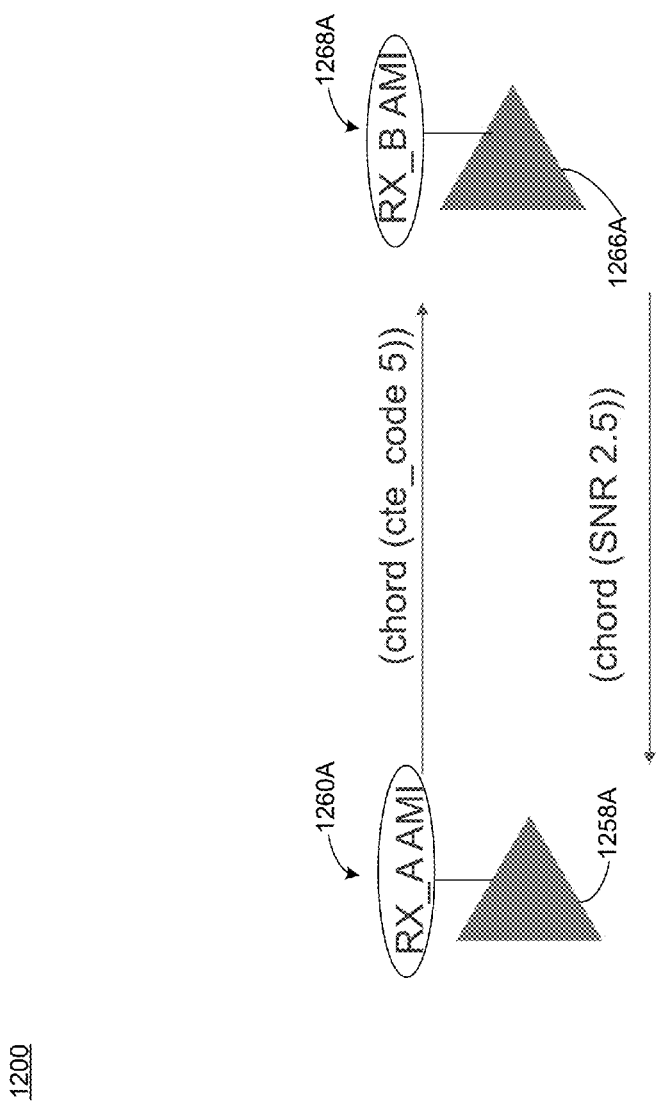
FIG. 12 is a diagram depicting post-comparator IBIS-AMI model and pre-comparator IBIS-AMI model communication incorporating channel simulation process in accordance with the present disclosure.

As discussed above, in some embodiments and referring also to FIGS. 11 and 12, at least one pre-comparator IBIS-AMI model 1160A, 1160B may be responsive to at least one post-comparator IBIS-AMI model 1168A, 1160B. In other words, at least one post-comparator IBIS-AMI model 1168A, 1168B may communicate with at least one pre-comparator IBIS-AMI model 1160A, 1160B. While communications have been described between IBIS-AMI models, an IBIS-AMI model may be considered as the combination of an IBIS model and an AMI model. In other words, communication between the at least one pre-comparator and post-comparator IBIS-AMI models may include communication between the pre-comparator AMI-models 1160A, 1160B and post-comparator AMI-models 1168A, 1168B. Communication between the post-comparator IBIS-AMI models 1168A, 1168B and pre-comparator IBIS-AMI models 1160A, 1160B may use API as defined in IBIS Version 6.

In one example, at least one pre-comparator AMI model, Rx_A AMI-model 1160A, may be configured to communicate with at least one post-comparator AMI model, Rx_B AMI-model 1168A, through standard AMI-API. In one example, the standard AMI-API may include and/or use an Ami_parameters_out argument as described in Section 10.2.3 of IBIS Version 6.0. In some embodiments, the chord-signaling related communication may be passed under a subtree of the EDA (e.g., subtree "chord"). In some embodiments, the AMI_parameters_out argument may be used to return parameters to an EDA tool. Returning to the example shown in FIG. 11, these parameters may be passed between RX_A AMI and RX_B AMI via an EDA tool.

Referring also to FIG. 12, channel simulation process 10 may include configuring communication between at least one post-comparator IBIS-AMI model 1268A associated with a post-comparator receiver 1266A and at least one pre-comparator IBIS-AMI model 1260A associated with a pre-comparator receiver 1258A. While this example refers to communication between a single post-comparator IBIS-AMI model and a single pre-comparator IBIS-AMI model, any combination of pre-comparator and post-comparator IBIS-AMI models may be configured to communicate with each other. In this example, a post-comparator IBIS-AMI model 1268A may sample an output waveform associated with a simulated output, compute the signal to noise ratio (SNR), and send the SNR (e.g., 2.5 in this example) to a pre-comparator IBIS-AMI 1260A. The pre-comparator IBIS-AMI model 1260A may adjust the cte code (e.g., 5 in this example) based on the SNR. A cte code, as used herein may include, but is not limited to, a continuous time equalizer code or other command that may modify a continuous time equalizer output. In some embodiments, the cte code may represent any filter or filter command/code that may adjust the pre-comparator output based upon feedback (e.g., SNR). The pre-comparator IBIS-AMI model 1260A may optionally send information regarding the change in the cte code to the post-comparator IBIS-AMI model 1268A. The post-comparator IBIS-AMI model 1268A may communicate with the pre-comparator IBIS-AMI model 1260A to modify the equalization operations of the pre-comparator AMI model 1260A.

In some embodiments, the two or more simulated outputs 564A, 564B may include one simulated output for each input of the two or more inputs 546A, 546B. In other words, channel simulation process 10 may model and simulate a channel 528 with IBIS-AMI models by transmitting two or more inputs 546A, 546B over two or more wires 534A, 534B, 534C and subsequently recovering the two or more bits, using a comparator block 562, as two or more simulated outputs 564A, 564B.

In some embodiments, channel simulation process 10 may allow high data-rates that cross the 25 to 32 Gigabytes-per-second (Gbps) limit of present SERDES at a lower power than traditional two-wire implementations.

Channel simulation process 10 may be configured to operate with various EDA applications such as those available from the Assignee of the present disclosure, which may allow the user to simulate a channel associated with an integrated circuit design. In some embodiments, the electronic circuit design may be received at a graphical user interface associated with the EDA application 20. In some embodiments, two or more inputs and a user definition for relationships between the two or more inputs of the comparator block and the two or more simulated outputs may be received at a graphical user interface associated with EDA application 20.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A method for simulating channels in an electronic circuit design comprising:
   receiving, at one or more computing devices, an electronic circuit design including at least one channel;
   transmitting two or more inputs from two or more transmitter drivers on two or more wires associated with the electronic circuit design to the at least one channel, wherein the two or more inputs are distributed across the two or more wires based upon, at least in part, a chordal code, wherein the chordal code includes a first set of vectors and one or more comparators;
   generating two or more simulated waveforms based upon, at least in part, the two or more inputs;
   transmitting the two or more simulated waveforms from the at least one channel on the two or more wires to a comparator block associated with the electronic circuit design;
   comparing the two or more simulated waveforms at the comparator block to produce two or more simulated outputs; and
   transmitting the two or more simulated outputs from the comparator block on the two or more wires to two or more post-comparator receivers associated with the electronic circuit design.

2. The method of claim 1, further comprising:
   transmitting the two or more simulated waveforms from the at least one channel on the two or more wires to two or more pre-comparator receivers associated with the electronic circuit design; and
   transmitting the two or more simulated waveforms from the two or more pre-comparator receivers on the two or more wires to the comparator block.

3. The method of claim 2, wherein the two or more pre-comparator receivers each include at least one pre-comparator Input-output Buffer Information Specification Algorithmic Modeling Interface (IBIS-AMI) model.

4. The method of claim 3, wherein the pre-comparator IBIS-AMI model is disposed to model equalization.

5. The method of claim 3, wherein the two or more post-comparator receivers each include at least one post-comparator IBIS-AMI model.

6. The method of claim 5, wherein the post-comparator IBIS-AMI model is disposed to model eye-calculation.

7. The method of claim 5, wherein the at least one pre-comparator IBIS-AMI model is responsive to the at least one post-configurator IBIS-AMI model.

8. The method of claim 1, further comprising:
generating at least one impulse response of the at least one channel; and
convolving the at least one impulse response with the two or more inputs to produce the two or more simulated waveforms.

9. The method of claim 1, wherein the comparator block is configurable by a user.

10. The method of claim 1, wherein the two or more inputs are singled-ended signals.

11. The method of claim 1, wherein the two or more simulated outputs include one simulated output for each input of the two or more inputs.

12. The method of claim 1, further comprising:
defining a plurality of relationships between the two or more inputs and the two or more simulated outputs.

13. A system for simulating channels in an electronic circuit design comprising:
a computing device having at least one processor configured to receive an electronic circuit design including at least one channel, the at least one processor further configured to transmit two or more inputs from two or more transmitter drivers on two or more wires associated with the electronic circuit design to the at least one channel, wherein the two or more inputs are distributed across the two or more wires based upon, at least in part, a chordal code, wherein the chordal code includes a first set of vectors and one or more comparators, the at least one processor further configured to generate two or more simulated waveforms based upon, at least in part, the two or more inputs, the at least one processor further configured to transmit the two or more simulated waveforms from the at least one channel on the two or more wires to a comparator block associated with the electronic circuit design, the at least one processor further configured to compare the two or more simulated waveforms at the comparator block to produce two or more simulated outputs, and the at least one processor further configured to transmit the two or more simulated outputs from the comparator block on the two or more wires to two or more post-comparator receivers associated with the electronic circuit design.

14. The system of claim 13, wherein the at least one processor is further configured to:
transmit the two or more simulated waveforms from the at least one channel on the two or more wires to two or more pre-comparator receivers associated with the electronic circuit design; and
transmit the two or more simulated waveforms from the two or more pre-comparator receivers on the two or more wires to the comparator block.

15. The system of claim 14, wherein the two or more pre-comparator receivers each include at least one pre-comparator IBIS-AMI model.

16. The system of claim 15, wherein the at least one pre-comparator IBIS-AMI model is disposed to model equalization.

17. The system of claim 15, wherein the two or more post-comparator receivers each include at least one post-comparator IBIS-AMI model.

18. The system of claim 17, wherein the at least one post-comparator IBIS-AMI model is disposed to model eye-calculation.

19. The system of claim 17, wherein the at least one pre-comparator IBIS-AMI model is responsive to the at least one post-configurator IBIS-AMI model.

20. A method for simulating channels in an electronic circuit design comprising:
receiving, at one or more computing devices, an electronic circuit design including at least one channel;
transmitting two or more inputs from two or more transmitter drivers on two or more wires associated with the electronic circuit design to the at least one channel, wherein the two or more inputs are distributed across the two or more wires based upon, at least in part, a chordal code, wherein the chordal code includes a first set of vectors and one or more comparators;
generating two or more simulated waveforms based upon, at least in part, the two or more inputs;
transmitting the two or more simulated waveforms from the at least one channel on the two or more wires to two or more pre-comparator receivers associated with the electronic circuit design, wherein the two or more pre-comparator receivers each include at least one pre-comparator IBIS-AMI model;
transmitting the two or more simulated waveforms from the two or more pre-comparator receivers on the two or more wires to a comparator block associated with the electronic circuit design;
comparing the two or more simulated waveforms at the comparator block to produce two or more simulated outputs; and
transmitting the two or more simulated outputs from the comparator block on the two or more wires to two or more post-comparator receivers associated with the electronic circuit design, wherein the two or more post-comparator receivers each include at least one post-comparator IBIS-AMI model.

* * * * *